(12) United States Patent
Nozaki

(10) Patent No.: US 7,068,926 B2
(45) Date of Patent: Jun. 27, 2006

(54) HEAT TREATMENT APPARATUS OF LIGHT-EMISSION TYPE AND METHOD OF CLEANING SAME

(75) Inventor: Yoshihide Nozaki, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 10/926,639

(22) Filed: Aug. 26, 2004

(65) Prior Publication Data

US 2005/0047767 A1    Mar. 3, 2005

(30) Foreign Application Priority Data

Aug. 26, 2003   (JP)   ............................. 2003-300683

(51) Int. Cl.
 *F26B 19/00*   (2006.01)
(52) U.S. Cl. ...................... 392/416; 392/418; 219/390; 219/405; 219/411; 118/724; 118/725; 118/50.1
(58) Field of Classification Search ................ 219/390, 219/405, 411; 392/416, 418; 118/724, 725, 118/50.1
See application file for complete search history.

(56) References Cited

U.S. PATENT DOCUMENTS 4,571,486 A   2/1986   Arai et al.
4,649,261 A   3/1987   Sheets 6,856,763 B1 *  2/2005   Allen et al. .................... 396/72

FOREIGN PATENT DOCUMENTS

| JP | 9-17705 | 1/1977 |
|---|---|---|
| JP | 57-162340 | 10/1982 |
| JP | 59-169125 | 9/1984 |
| JP | 60-258928 | 12/1985 |
| JP | 63-166219 | 7/1988 |
| JP | 7-230954 | 8/1995 |
| JP | 7-321046 | 12/1995 |
| JP | 2001-237195 | 8/2001 |

* cited by examiner

*Primary Examiner*—Shawntina Fuqua
(74) *Attorney, Agent, or Firm*—Ostrolenk, Faber, Gerb & Soffen, LLP

(57) ABSTRACT

After the maintenance of a heat treatment apparatus, a susceptor and a heating plate are moved upwardly and a nitrogen gas flow from an inlet toward an outlet passage is produced prior to heat treating a semiconductor wafer. In this state, flash lamps are turned on to cause momentary expansion and contraction of the gas in a chamber, thereby scattering particles deposited on a bottom plate, etc. The scattered particles are removed by the nitrogen gas passing through a bottom portion of the chamber and discharged through the outlet passage. The particles are easily removed due to the flash lamps being turned on a predetermined number of times at fixed time intervals while folowing the nitrogen gas. The heat treatment apparatus has a light-emission characteristic and easily removes the particles in the chamber.

12 Claims, 5 Drawing Sheets

F I G . 4
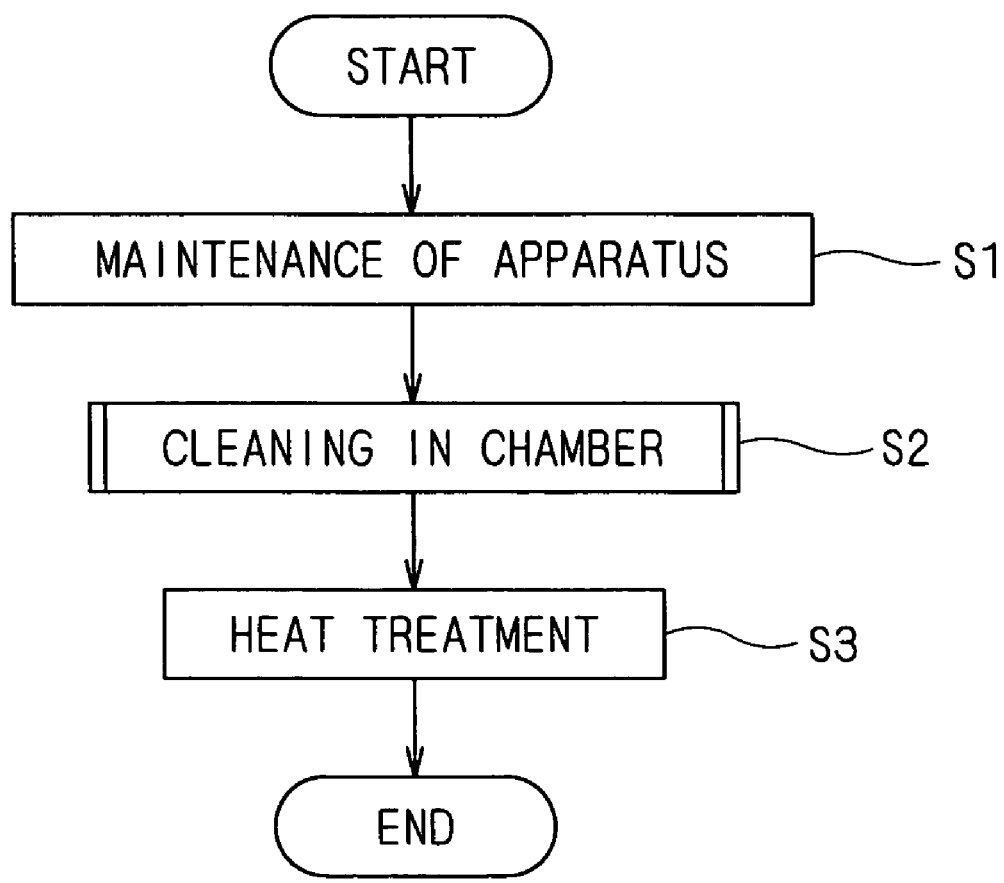

HEAT TREATMENT APPARATUS OF LIGHT-EMISSION TYPE AND METHOD OF CLEANING SAME

BACKGROUND OF THE INVENTION

1. Field of the Invention

The present invention relates to a heat treatment apparatus of a light-emission type for exposing a substrate including a semiconductor wafer, a glass substrate and the like received within a process chamber to a flash of light to heat the substrate, and a method of cleaning the heat treatment apparatus of the light-emission type.

2. Description of the Background Art

As is well known in the art, semiconductor parts are manufactured after passing through a multiplicity of process steps, and various manufacturing apparatuses corresponding to the respective process steps are employed for the manufacture. Many of the apparatuses are each provided with a cleaning mechanism therein because the manufacture of the semiconductor parts and the like becoming finer necessitates an ultraclean atmosphere. For example, Japanese Patent Application Laid-Open No. 7-321046 (1995) discloses a technique for removing organic materials on a substrate by passing an ozone gas under ultraviolet irradiation. Also, Japanese Patent Application Laid-Open No. 9-17705 (1997) discloses a technique for cleaning away undesired films deposited on the inner wall surfaces of a process chamber and the surfaces of a structure inside the process chamber at about 200° C. while feeding a $ClF_3$ gas thereto. Further, Japanese Patent Application Laid-Open No. 7-230954 (1995) discloses a cleaning technique which heats residues deposited on the surfaces of a structural component inside a chamber to decompose and remove the residues in a plasma processing apparatus.

One of the steps for manufacturing semiconductor parts and the like includes an ion implantation step for implanting ions of boron, arsenic and the like into a silicon wafer. A heating process is performed for the purpose of activating the ions implanted in the semiconductor wafer. The heating process for the activation of the ions is carried out by heating (or annealing) the semiconductor wafer to a temperature of, for example, about 1000° C. to about 1100° C. For this process, a lamp annealer has been conventionally used which utilizes the energy of light emitted from a halogen lamp to raise the temperature of the wafer at a rate of about hundreds of degrees per second.

It has turned out, however, that even the execution of the process of activating the ions implanted in the semiconductor wafer by the use of a heat treatment apparatus which employs a halogen lamp to raise the temperature of the semiconductor wafer at a rate of about hundreds of degrees per second causes a phenomenon in which the ions implanted in the semiconductor wafer exhibit a round or dull profile, i.e., the ions are diffused by heat. The occurrence of such a phenomenon has created a problem such that more ions than necessary must be implanted because the implanted ions are diffused if the ions are implanted even at a high concentration into the surface of the semiconductor wafer.

To solve the above-mentioned ion diffusion problem, for example, Japanese Patent Application Laid-Open No. 59-169125 (1984) and Japanese Patent Application Laid-Open No. 63-166219 (1988) have proposed a technique of exposing the surface of a semiconductor wafer to a flash of light from a xenon flash lamp or the like to raise the temperature of only the surface of the semiconductor wafer implanted with ions in an extremely short time (several milliseconds or less). Because there is not enough time for the ions to diffuse, the temperature rise in such an extremely short time by the use of the xenon flash lamp allows only the activation of the ions without providing the round or dull profile of the ions implanted in the semiconductor wafer.

In such a flash lamp annealer, there are cases where the breakage of a semiconductor wafer occurs due to the momentary exposure of the semiconductor wafer to light having enormous energy during flash heating. If a semiconductor wafer is cracked and broken, a large amount of particles resulting from the broken pieces of the semiconductor wafer itself and damages to a peripheral structure are produced in a chamber. When the breakage of a semiconductor wafer occurs, the chamber is opened, of course, for maintenance including collecting the broken pieces. It is, however, quite difficult to completely remove the produced particles. Further, opening the chamber causes new external particles to enter the chamber. If the flash heating process is performed while particles remain in the chamber, the particles adhere to the semiconductor wafer to result in a processing failure.

To prevent this, a technique has been conventionally adopted which performs flash heating upon dummy wafers after the maintenance is performed with the chamber opened, to cause the particles to adhere to the dummy wafers, thereby removing the particles. However, the removal of the particles remaining in the chamber to an acceptable level or lower requires a substantial number of dummy wafers and a substantial amount of time, resulting in a significant increase in cost.

SUMMARY OF THE INVENTION

The present invention is intended for a heat treatment apparatus for exposing a substrate to a flash of light to heat the substrate.

According to the present invention, the heat treatment apparatus comprises: a process chamber for receiving a substrate therein; a flash lamp for emitting a flash of light toward the interior of the process chamber to scatter particles in a treatment space within the process chamber; and an exhaust element for exhausting gas from the treatment space.

Only turning on the flash lamp while exhausting the gas allows the scattered particles to be discharged out of the process chamber. Therefore, the heat treatment apparatus can easily remove the particles in the process chamber.

According to an aspect of the present invention, the heat treatment apparatus comprises: a process chamber for receiving a substrate therein; a flash lamp for emitting a flash of light toward the interior of the process chamber; an exhaust element for exhausting gas from a treatment space within the process chamber; and a control element for controlling the flash lamp to emit a flash of light toward the interior of the process chamber, with an objective substrate prohibited from being transported into the process chamber.

Only turning on the flash lamp while exhausting the gas allows the particles in the treatment space to rise and be discharged out of the process chamber. Therefore, the heat treatment apparatus can easily remove the particles in the process chamber. In addition, emitting a flash of light toward the interior of the process chamber, with the objective substrate prohibited from being transported into the process chamber, reliably prevents the particles from being deposited on the objective substrate.

The present invention is also intended for a method of cleaning a heat treatment apparatus for exposing a substrate received in a process chamber to a flash of light to heat the substrate.

It is therefore an object of the present invention to provide a heat treatment apparatus capable of easily removing particles in a process chamber, and a method of cleaning the heat treatment apparatus.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a flow chart showing the procedure of operation of the heat treatment apparatus shown in FIG. 1.

DESCRIPTION OF THE PREFERRED EMBODIMENTS

A preferred embodiment according to the present invention will now be described in detail with reference to the drawings.

Figure 1:
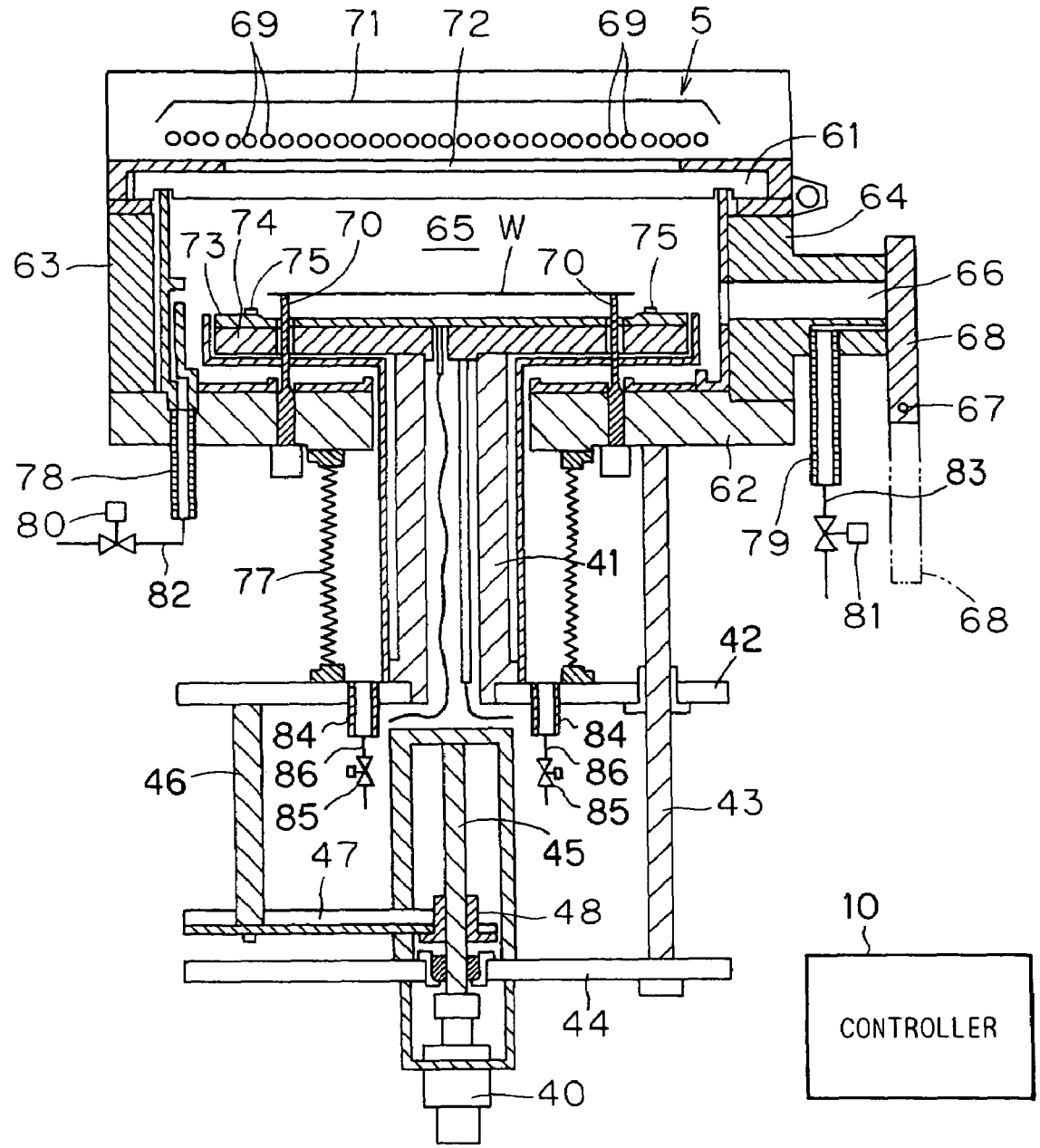
FIGS. 1 and 2 are side sectional views showing the construction of a heat treatment apparatus according to the present invention.
Figure 2:
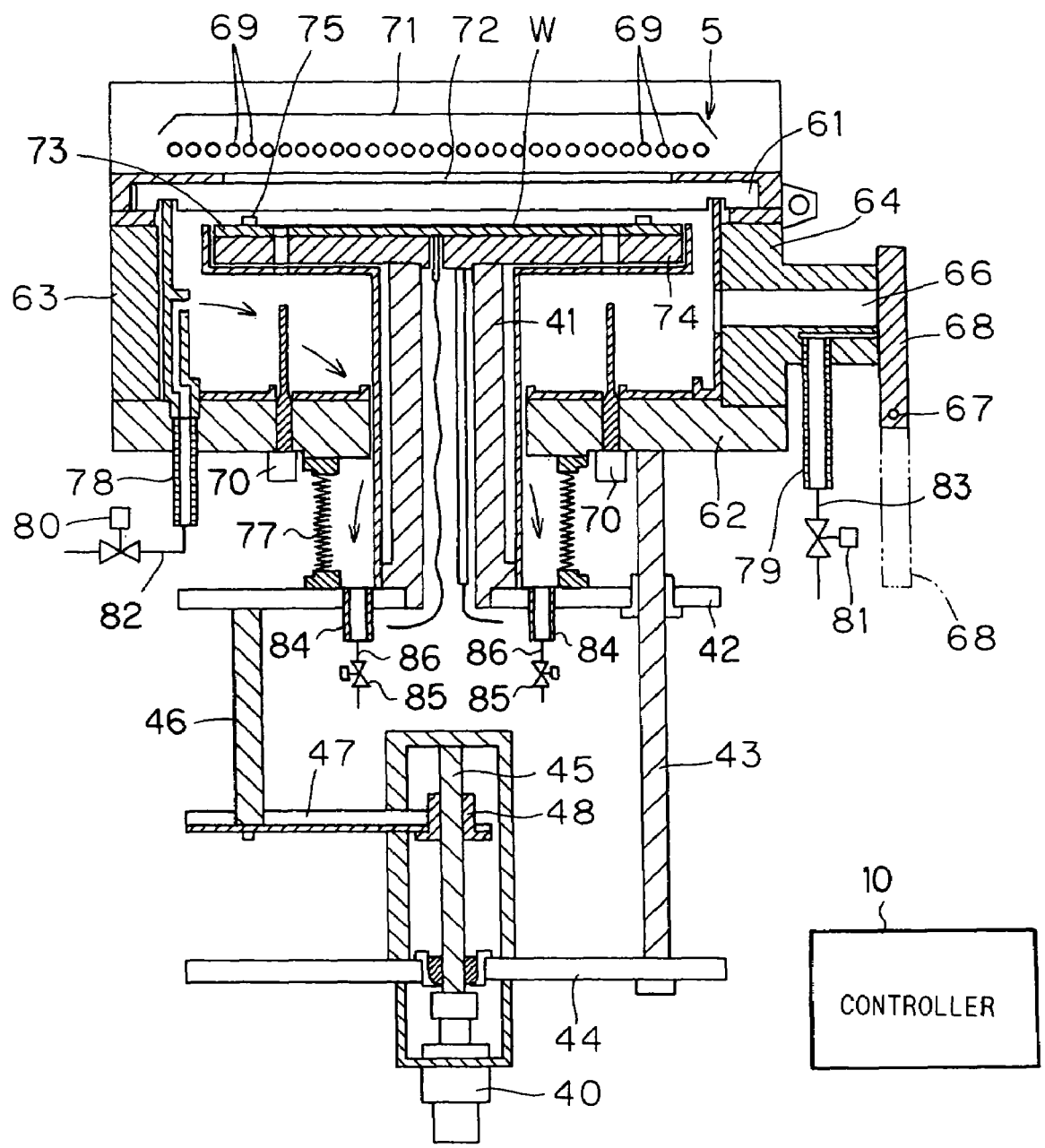

FIGS. 1 and 2 are side sectional views showing the construction of a heat treatment apparatus according to the present invention. The heat treatment apparatus according to the present invention is an apparatus for heat-treating a substrate including a circular semiconductor wafer and the like by the use of a flash of light from xenon flash lamps.

The heat treatment apparatus according to the present invention comprises a chamber 65. The chamber 65 includes a light-transmittable plate 61, a bottom plate 62 and a pair of side plates 63 and 64, and receives a semiconductor wafer W therein to heat-treat the semiconductor wafer W. The light-transmittable plate 61 constituting an upper portion of the chamber 65 is made of, for example, a material transmissive to light such as quartz, and functions as a chamber window for allowing light emitted from a light source 5 to pass therethrough into the chamber 65. The bottom plate 62 constituting the chamber 65 is provided with upright support pins 70 extending through a susceptor 73 and a heating plate 74 to be described later for supporting the lower surface of the semiconductor wafer W.

The side plate 64 constituting the chamber 65 is provided with an opening 66 for the transport of the semiconductor wafer W therethrough into and out of the chamber 65. The opening 66 is openable and closable by a gate valve 68 pivoting about an axis 67. With the opening 66 open, the semiconductor wafer W is transported into the chamber 65 by a transport robot not shown. During the heat treatment of the semiconductor wafer W in the chamber 65, the opening 66 is closed by the gate valve 68.

The chamber 65 is provided under the light source 5. The light source 5 includes a plurality of (in this preferred embodiment, 30) xenon flash lamps 69 (also referred to simply as "flash lamps 69" hereinafter), and a reflector 71. The plurality of flash lamps 69 each of which is a rodlike lamp having an elongated cylindrical configuration are arranged in parallel and each extending in a horizontal direction. The reflector 71 is provided over the plurality of flash lamps 69 to cover all of the flash lamps 69.

Each of the xenon flash lamps 69 includes a glass tube containing xenon gas sealed therein and having positive and negative electrodes provided on opposite ends thereof and connected to a capacitor, and a trigger electrode wound around the glass tube. Because the xenon gas is electrically insulative, no current flows in the glass tube in a normal state. However, if a high voltage is applied to the trigger electrode to produce an electrical breakdown, electricity stored in the capacitor flows momentarily in the glass tube, and the Joule heat evolved at this time heats the xenon gas to cause light emission. The xenon flash lamps 69 have the property of being capable of emitting much intenser light than a light source that stays lit continuously because previously stored electrostatic energy is converted into an ultrashort light pulse ranging from 0.1 millisecond to 10 milliseconds.

A light diffusion plate 72 is provided between the light source 5 and the light-transmittable plate 61. The light diffusion plate 72 used herein is made of quartz glass as a light-transmittable material with a surface thereof subjected to a light diffusion process.

Part of the light emitted from the flash lamps 69 directly passes through the light diffusion plate 72 and the light-transmittable plate 61 into the chamber 65. A different part of the light emitted from the flash lamps 69 is reflected once from the reflector 71 and then passes through the light diffusion plate 72 and the light-transmittable plate 61 into the chamber 65.

The heating plate 74 and the susceptor 73 are provided in the chamber 65. The susceptor 73 is provided on the upper surface of the heating plate 74. Pins 75 for preventing the semiconductor wafer W from shifting out of place are mounted on the surface of the susceptor 73. In the chamber 65, the semiconductor wafer W is held in a substantially horizontal position directly by the susceptor 73.

The heating plate 74 is provided for preheating (or assist-heating) the semiconductor wafer W. The heating plate 74 is made of aluminum nitride, and is structured to incorporate therein a heater and a sensor for controlling the heater. The susceptor 73, on the other hand, is provided for positioning and holding the semiconductor wafer W and for diffusing heat energy from the heating plate 74 to uniformly preheat the semiconductor wafer W. The material of the susceptor 73 employed herein includes quartz, high-purity ceramic, and the like. Like the heating plate 74, the susceptor 73 may be made of aluminum nitride.

The susceptor 73 and the heating plate 74 are driven by a motor 40 to vertically move between a wafer transport position in which the semiconductor wafer W is transported into and out of the chamber 65 as shown in FIG. 1 and a wafer heat treatment position in which the semiconductor wafer W is heat-treated as shown in FIG. 2.

Specifically, the heating plate 74 is coupled to a movable plate 42 by a tubular element 41. The movable plate 42 is guided by a guide member 43 suspended from the bottom plate 62 of the chamber 65 to be able to move vertically. A fixed plate 44 is fixed on the lower end of the guide member 43, and the motor 40 for rotatably driving a ball screw 45 is provided in a central portion of the fixed plate 44. The ball screw 45 is in threaded engagement with a nut 48 coupled to the movable plate 42 by coupling members 46 and 47. With this arrangement, the susceptor 73 and the heating plate 74 are driven by the motor 40 to be able to move vertically between the wafer transport position in which the semiconductor wafer W is transported into and out of the chamber

65 as shown in FIG. 1 and the wafer heat treatment position in which the semiconductor wafer W is heat-treated as shown in FIG. 2.

The wafer transport position shown in FIG. 1 corresponds to the lowered position of the susceptor 73 and the heating plate 74 so that the semiconductor wafer W transported through the opening 66 into the chamber 65 is placed onto the support pins 70 by the use of the transport robot not shown or so that the semiconductor wafer W placed on the support pins 70 is transported through the opening 66 out of the chamber 65. Specifically, the susceptor 73 and the heating plate 74 which are vertically movable are provided with through holes which enable the support pins 70 fixed upright on the bottom plate 62 to pass therethrough relative to the susceptor 73 and the heating plate 74. When the susceptor 73 and the heating plate 74 move downwardly to the wafer transport position, the upper ends of the support pins 70 protrude out of the upper surface of the susceptor 73 to be able to receive the semiconductor wafer W thereon.

The wafer heat treatment position shown in FIG. 2, on the other hand, corresponds to the raised position of the susceptor 73 and the heating plate 74 above the upper ends of the support pins 70 for the heat treatment of the semiconductor wafer W. When the susceptor 73 and the heating plate 74 move upwardly to the wafer heat treatment position, the upper ends of the support pins 70 are below the upper surface of the susceptor 73 as shown in FIG. 2, and the semiconductor wafer W placed on the support pins 70 is received by the susceptor 73. Thus, the motor 40 vertically moves the susceptor 73 and the heating plate 74 relative to the support pins 70 between the wafer transport position shown in FIG. 1 and the wafer heat treatment position shown in FIG. 2.

In the course of the downward movement of the susceptor 73 and the heating plate 74 from the wafer heat treatment position shown in FIG. 2 to the wafer transport position shown in FIG. 1, the semiconductor wafer W supported by the susceptor 73 is transferred to the support pins 70. On the other hand, in the course of the upward movement of the susceptor 73 and the heating plate 74 from the wafer transport position shown in FIG. 1 to the wafer heat treatment position shown in FIG. 2, the semiconductor wafer W placed on the support pins 70 is received by the susceptor 73, is lifted with the lower surface thereof supported by the upper surface of the susceptor 73, and is held in a horizontal position in proximity to the light-transmittable plate 61 in the chamber 65.

When the susceptor 73 and the heating plate 74 which support the semiconductor wafer W are raised to the wafer heat treatment position, the light-transmittable plate 61 is situated between the light source 5 and the semiconductor wafer W held by the susceptor 73 and heating plate 74. A distance between the susceptor 73 and the light source 5 at this time is adjustable to any value by controlling the amount of rotation of the motor 40.

An expandable/contractible bellows 77 surrounding the tubular element 41 for maintaining the chamber 65 hermetically sealed is provided between the bottom plate 62 of the chamber 65 and the movable plate 42. The bellows 77 contacts when the susceptor 73 and the heating plate 74 are raised to the wafer heat treatment position, and expands when the susceptor 73 and the heating plate 74 are lowered to the wafer transport position. The bellows 77 cuts off communication between an atmosphere inside the chamber 65 and the external atmosphere.

The side plate 63 on the opposite side of the chamber 65 from the opening 66 is formed with an inlet passage 78. The inlet passage 78 is connected in communication with a gas source not shown through a gas pipe 82. An on-off valve 80 is inserted in the gas pipe 82. Opening the on-off valve 80 provides a gas, e.g. inert nitrogen gas, required for processing through the distal end of the inlet passage 78 into the chamber 65. When entering the chamber 65, the nitrogen gas is directed substantially horizontally. When the nitrogen gas is supplied through the inlet passage 78 while the susceptor 73 and the heating plate 74 are raised to the wafer heat treatment position, the nitrogen gas is supplied to a space between the heating plate 74 and the bottom plate 62, as shown in FIG. 2. In other words, the inert nitrogen gas is supplied to a bottom portion of the chamber 65.

The opening 66 in the side plate 64, on the other hand, is provided with an outlet passage 79. The outlet passage 79 is connected in communication with an exhaust element not shown through an exhaust pipe 83. An on-off valve 81 is inserted in the exhaust pipe 83. Opening the on-off valve 81 causes the gas in the chamber 65 to be discharged through the opening 66 out of the outlet passage 79.

The movable plate 42 is also formed with outlet passages 84. The distal ends of the respective outlet passages 84 are in communication with the space between the bellows 77 and the tubular element 41, and the proximal ends thereof are connected in communication with an exhaust element not shown through exhaust pipes 86, respectively. On-off valves 85 are inserted in the exhaust pipes 86, respectively. Opening the on-off valves 85 causes the gas in the chamber 65 to be discharged through the space between the bellows 77 and the tubular element 41 out of the outlet passages 84. In other words, the outlet passages 84 exhaust the gas in the interior space of the chamber 65 through the bottom portion of the chamber 65, as shown in FIG. 2.

Figure 3:
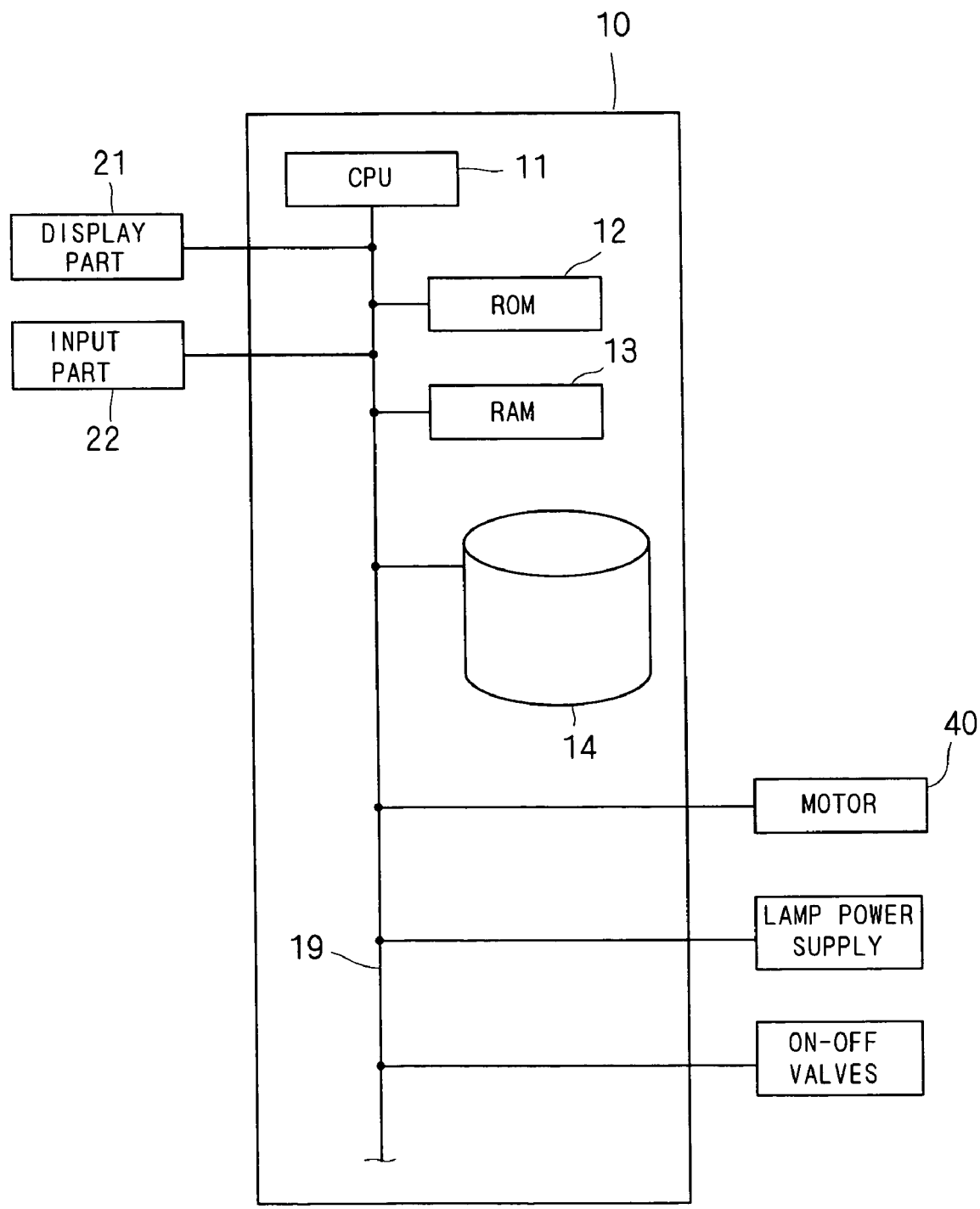
FIG. 3 is a block diagram showing the construction of a controller for the heat treatment apparatus shown in FIG. 1.

The above-mentioned heat treatment apparatus further comprises a controller 10 for controlling mechanical components such as the motor 40. FIG. 3 is a block diagram showing the construction of the controller 10. The controller 10 is similar in hardware construction to a typical computer. Specifically, the controller 10 includes a CPU 11 for performing various computation processes, a ROM 12 or read-only memory for storing a basic program therein, a RAM 13 or readable/writable memory for storing various pieces of information, a magnetic disk 14 for storing control software and data therein, and a bus line 19 connected to these components 11 to 14.

The bus line 19 is also electrically connected to the motor 40 of the heat treatment apparatus, a lamp power supply circuit not shown for the flash lamps 69, and the on-off valves 80, 81 and 85. By executing the control software stored in the magnetic disk 14, the CPU 11 of the controller 10 controls the turn-on timing of the flash lamps 69, controls the motor 40 to adjust the level or vertical position of the susceptor 73 and the heating plate 74, and controls the supply and exhaust of gas to and out of the chamber 65.

The bus line 19 is also electrically connected to a display part 21 and an input part 22. The display part 21 is constructed using, for example, a liquid crystal display, and displays various pieces of information such as processing results and recipe details. The input part 22 is constructed using, for example, a keyboard and a mouse, and accepts the entry of a command, a parameter and the like. An operator of the heat treatment apparatus can enter a command, a parameter and the like through the input part 22 while viewing the descriptions displayed on the display part 21. The display part 21 and the input part 22 may be integrated together into a touch panel device.

Next, the operation of the heat treatment apparatus according to the present invention will be described. FIG. 4 is a flow chart showing the procedure of the operation of the heat treatment apparatus according to the present invention. The apparatus start-up procedure including the maintenance of the heat treatment apparatus is shown in FIG. 4.

First, the maintenance of the heat treatment apparatus is performed in Step S1. The maintenance in Step S1 may be performed at regular time intervals or at irregular time intervals, for example, whenever the breakage of a semiconductor wafer W occurs in the chamber 65. In either case, the maintenance is performed while the light source 5 is removed and the interior of the chamber 65 is open to the external atmosphere. This causes external particles to enter the chamber 65 during the maintenance. If the maintenance is due to the breakage of a semiconductor wafer W, additional particles result from the broken pieces of the semiconductor wafer W.

Figure 5:
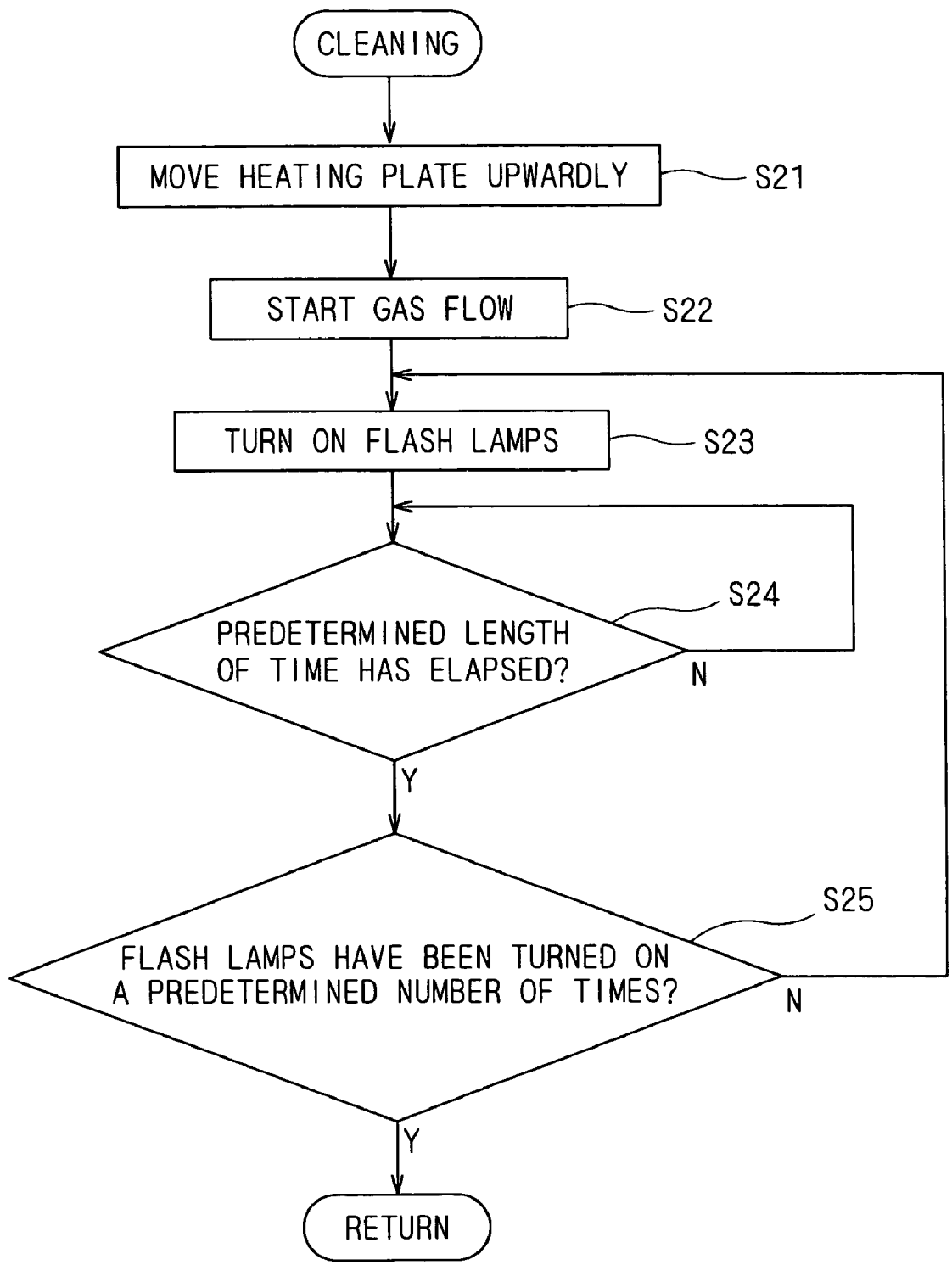
FIG. 5 is a flowchart showing the procedure of a cleaning process.

After the predetermined maintenance process, the procedure proceeds to Step S2. In Step S2, the light source 5 is mounted to the upper portion of the chamber 65 (into a condition shown in FIG. 1), and a cleaning process is performed in the chamber 65. The cleaning process is the process of removing particles in the chamber 65 to a predetermined level or lower. FIG. 5 is a flow chart showing the procedure of the cleaning process. The process shown in FIG. 5 is executed by the operations of the mechanical components such as the lamp power supply circuit in accordance with instructions from the controller 10.

For the execution of the cleaning process, any objective semiconductor wafer W is prohibited from being transported into the chamber 65, and the susceptor 73 and the heating plate 74 are moved upwardly to the wafer heat treatment position shown in FIG. 2 (in Step S21). Thus, during the cleaning process, there is no semiconductor wafer W in the chamber 65, and the susceptor 73 with no semiconductor wafer W placed thereon is moved upwardly to the wafer heat treatment position. The heater in the heating plate 74 is OFF so that the heating plate 74 remains unheated.

After the susceptor 73 and the heating plate 74 move upwardly to the wafer heat treatment position, a flow of nitrogen gas is produced in the chamber 65 (in Step S22). Specifically, opening the on-off valves 80, 81 and 85 produces the flow of nitrogen gas directed from the inlet passage 78 toward the outlet passages 79 and 84. Although the on-off valve 81 may remain closed, the on-off valves 85 must be assuredly opened. This produces the gas flow passing through the bottom portion of the chamber 65 and then exhausted out of the chamber 65, as indicated by arrows in FIG. 2.

Thereafter, the flash lamps 69 are turned on to emit a flash of light toward the interior of the chamber 65. The length of time during which the flash lamps 69 are ON ranges from about 0.1 millisecond to about 10 milliseconds. The flash lamps 69 emit an extremely intense flash of light toward the interior of the chamber 65 because previously stored electrostatic energy is converted into such an ultrashort light pulse. The emission of the flash of light from the flash lamps 69 heats the gas and the structural components in the chamber 65 to cause the momentary expansion and contraction of the gas in the chamber 65, resulting in particles raised to scatter in the chamber 65. Particles are prone to be deposited particularly on the bottom portion of the chamber 65 (or the upper surface of the bottom plate 62). However, the emission of the flash of light, with the heating plate 74 moved upwardly to the wafer heat treatment position as in this preferred embodiment, easily raises such particles deposited on the bottom portion.

The particles scattering in this manner is carried by the flow of nitrogen gas to the outside of the chamber 65. As discussed above, particles are prone to scatter particularly near the bottom portion of the chamber 65. However, the gas flow passing through the bottom portion of the chamber 65 and then exhausted out of the chamber 65 is produced in this preferred embodiment, thereby to efficiently discharge the particles scattering near the bottom portion of the chamber 65 to the outside of the chamber 65.

The controller 10 judges whether or not a predetermined length of time has elapsed since the turn-on of the flash lamps 69 (in Step S24). Thus, the particles are discharged for the predetermined length of time after the emission of the single flash of light. Such a flow of nitrogen gas passing through the bottom portion of the chamber 65 and then exhausted out of the chamber 65 continues to be produced even during the lapse of the predetermined length of time.

After the predetermined length of time has elapsed, considerable amounts of particles are discharged to the outside of the chamber 65, but some particles are deposited again on the bottom portion of the chamber 65. Then, the controller 10 judges whether or not the flash lamps 69 have been turned on a predetermined number of times (in Step S25). When the number of times that the flash lamps 69 turn on is less than the predetermined number of times, the procedure returns to Step S23 in which the flash lamps 69 are turned on again. The emission of a flash of light by the turn-on of the flash lamps 69 causes the particles deposited again to rise and scatter, and the flow of nitrogen gas carries the particles to the outside of the chamber 65. When the number of times that the flash lamps 69 turn on is equal to the predetermined number of times, the cleaning process is terminated.

In the preferred embodiment according to the present invention as described above, the cleaning process is performed by turning on the flash lamps 69 the predetermined number of times at fixed time intervals while continuing to produce the flow of nitrogen gas passing through the bottom portion of the chamber 65 and then discharged out of the chamber 65. As an example, turning on the flash lamps 69 thirty times at intervals of two minutes removes the particles in the chamber 65 to an acceptable level or lower.

Referring again to FIG. 4, after the completion of the cleaning process in the chamber 65, the procedure proceeds to Step S3 for the heat treatment of a semiconductor wafer W. An objective semiconductor wafer W to be heat-treated in the heat treatment apparatus according to the present invention is a semiconductor wafer implanted with ions.

In the heat treatment process step, with the susceptor 73 and the heating plate 74 situated in the wafer transport position shown in FIG. 1, the transport robot not shown transports the semiconductor wafer W through the opening 66 into the chamber 65, and places the semiconductor wafer W onto the support pins 70. After the semiconductor wafer W is transported in the chamber 65, the opening 66 is closed by the gate valve 68. Thereafter, the susceptor 73 and the heating plate 74 are driven by the motor 40 to move upwardly to the wafer heat treatment position shown in FIG. 2, thereby holding the semiconductor wafer W in a horizontal position. The on-off valves 80, 81 and 85 are opened to produce the flow of nitrogen gas in the chamber 65.

The susceptor 73 and the heating plate 74 are previously heated to a predetermined temperature under the action of the heater incorporated in the heating plate 74. Thus, with the susceptor 73 and the heating plate 74 moved upwardly to the wafer heat treatment position, the semiconductor wafer W is preheated by contacting the susceptor 73 being heated, and the temperature of the semiconductor wafer W rises gradually.

In this state, the semiconductor wafer W is heated through the susceptor 73 without interruption. During the temperature rise of the semiconductor wafer W, a temperature sensor not shown in the heating plate 74 always monitors whether or not the internal temperature of the heating plate 74 has reached a preset temperature which makes the surface temperature of the semiconductor wafer W equal to a preheating temperature T1.

The preheating temperature T1 ranges, for example, from about 200° C. to about 600° C. Heating the semiconductor wafer W to the preheating temperature T1 within such a range does not diffuse the ions implanted in the semiconductor wafer W.

When the surface temperature of the semiconductor wafer W reaches the preheating temperature T1, the flash lamps 69 are turned on to perform flash heating. The length of time during which the flash lamps 69 are ON in the flash heating process step ranges from about 0.1 millisecond to about 10 milliseconds. The flash lamps 69 emit an extremely intense flash of light because previously stored electrostatic energy is converted into such an ultrashort light pulse.

Such flash heating causes the surface temperature of the semiconductor wafer W to momentarily reach a temperature T2. The temperature T2 is a temperature ranging from about 1000° C. to about 1100° C. and required for the process of activating the ions in the semiconductor wafer W. The temperature rise of the surface of the semiconductor wafer W to such a treatment temperature T2 activates the ions implanted in the semiconductor wafer W.

In this process, the activation of the ions in the semiconductor wafer W is completed in a short time because the surface temperature of the semiconductor wafer W is raised to the treatment temperature T2 in an extremely short time ranging from about 0.1 millisecond to 10 milliseconds. This causes no diffusion of the ions implanted in the semiconductor wafer W, thereby to prevent the phenomenon in which the ions implanted in the semiconductor wafer W exhibit a round or dull profile. Because the length of time required for the activation of ions is much shorter than the length of time required for the diffusion of the ions, the activation of the ions is completed even in a short time ranging from about 0.1 millisecond to about 10 milliseconds which causes no diffusion.

Additionally, the surface temperature of the semiconductor wafer W is raised by heating up to the preheating temperature T1 ranging from about 200° C. to about 600° C. by the use of the heating plate 74 before the flash lamps 69 are turned on to heat the semiconductor wafer W. This enables the flash lamps 69 to rapidly raise the temperature of the semiconductor wafer W up to the treatment temperature T2 ranging from about 1000° C. to about 1100° C.

After the flash heating process step, the susceptor 73 and the heating plate 74 are driven by the motor 40 to move downwardly to the wafer transport position shown in FIG. 1, and the opening 66 having been closed is opened by the gate valve 68. The transport robot not shown transports the semiconductor wafer W placed on the support pins 70 out of the chamber 65. In the above-mentioned manner, a series of heat treatment operations are completed.

As described hereinabove, the cleaning process in the chamber in the preferred embodiment according to the present invention includes turning on the flash lamps 69 the predetermined number of times at fixed time intervals while continuing to produce the flow of nitrogen gas in the chamber 65, thereby raising and discharging the particles deposited on the bottom portion of the chamber 65. This cleaning process removes the particles in the chamber 65 very easily without the need to use the conventional special dummy wafers. As a result, the cleaning process achieves the reductions in the number of steps required for the start-up of the heat treatment apparatus, in time and in costs after the maintenance.

In particular, this preferred embodiment features the production of the flow of nitrogen gas passing through the bottom portion of the chamber 65 and then discharged out of the chamber 65 by opening the on-off valves 85. This efficiently removes the particles prone to be deposited on the bottom portion of the chamber 65.

While the preferred embodiment according to the present invention has been described hereinabove, the present invention is not limited to the above-mentioned examples. For example, although the light source 5 includes the 30 flash lamps 69 in the above preferred embodiment, the number of flash lamps 69 is not limited to this, but the light source 5 may include any number of flash lamps 69.

The time intervals and number of times that the flash lamps 69 turn on during the cleaning process are not limited to two minutes and 30 times, respectively, but may be set at any value depending on the amounts of particles remaining in the chamber 65.

Although the ions are activated by exposing the semiconductor wafer to light in the above-mentioned preferred embodiment, the objective substrates to be heat-treated in the heat treatment apparatus according to the present invention are not limited to the semiconductor wafer. For instance, the heat treatment apparatus according to the present invention may treat glass substrates formed with various silicon films such as a silicon nitride film and a polycrystalline silicon film. An example of such modifications of the present invention may be made in a manner to be described below. Implanting ions of silicon into a polycrystalline silicon film formed on a glass substrate by using a CVD process gives rise to amorphization to form an amorphous silicon film. A silicon oxide film serving as an anti-reflection film is formed on the amorphous silicon film. In this state, the heat treatment apparatus according to the present invention exposes the entire surface of the amorphous silicon film to light to polycrystallize the amorphous silicon film, thereby forming a polycrystalline silicon film.

Another example of such modifications may be made in a manner to be described below. An underlying silicon oxide film is formed on a glass substrate, and a polysilicon film obtained by crystallizing amorphous silicon is formed on the underlying silicon oxide film. The heat treatment apparatus according to the present invention exposes to light a TFT substrate formed by doping the polysilicon film with impurities such as phosphorus and boron, to activate the impurities implanted in the doping process step.

Further, the heater in the heating plate 74 may remain ON during the cleaning process. This achieves immediate transition to the heat treatment process step for the semiconductor wafer W to be actually treated.

While the invention has been described in detail, the foregoing description is in all aspects illustrative and not restrictive. It is understood that numerous other modifications and variations can be devised without departing from the scope of the invention.

What is claimed is:

1. A heat treatment apparatus for exposing a substrate to a flash of light to heat the substrate, comprising:

a process chamber for receiving a substrate therein;

a flash lamp for emitting a flash of light toward the interior of said process chamber to scatter particles in a treatment space within said process chamber;

an exhaust element for exhausting gas from said treatment space; and a control element for controlling said flash lamp to emit a flash of light toward the interior of said process chamber, with an objective substrate prohibited from being transported into said process chamber.

2. The heat treatment apparatus according to claim 1, wherein said exhaust element exhausts gas from said treatment space through a bottom portion of said process chamber.

3. The heat treatment apparatus according to claim 2, further comprising a gas supply element for supplying an inert gas to the bottom portion of said process chamber.

4. A heat treatment apparatus for exposing a substrate to flash of light to heat the substrate, comprising:

a process chamber for receiving a substrate therein;

a flash lamp for emitting a flash of light toward the interior of said process chamber;

an exhaust element for exhausting gas from a treatment space within said process chamber; and a control element for controlling said flash lamp to emit a flash of light toward the interior of said process chamber, with an objective substrate prohibited from being transported into said process chamber.

5. The heat treatment apparatus according to claim 4, wherein said exhaust element exhausts gas from said treatment space through a bottom portion of said process chamber.

6. The heat treatment apparatus according to claim 5, further comprising a gas supply element for supplying an inert gas to the bottom portion of said process chamber.

7. A method of cleaning a heat treatment apparatus, said heat treatment apparatus exposing a substrate received in a process chamber to a flash of light to heat the substrate, said method comprising the steps of:

a) emitting a flash of light from a flash lamp toward the interior of said process chamber, with an objective substrate prohibited from being transported into said process chamber, to scatter particles in a treatment space within said process chamber; and b) exhausting gas from said treatment space with the particles scattered therein.

8. The method according to claim 7, wherein said step b) includes exhausting gas from said treatment space through a bottom portion of said process chamber.

9. The method according to claim 8, further comprising the step of c) supplying an inert gas to the bottom portion of said process chamber.

10. A method of cleaning a heat treatment apparatus, said heat treatment apparatus exposing a substrate received in a process chamber to a flash of light to heat the substrate, said method comprising the steps of:

a) emitting a flash of light from a flash lamp toward the interior of said process chamber, with an objective substrate prohibited from being transported into said process chamber; and b) exhausting gas from a treatment space within said process chamber.

11. The method according to claim 10, wherein said step b) includes exhausting gas from said treatment space through a bottom portion of said process chamber.

12. The method according to claim 11, further comprising the step of c) supplying an inert gas to the bottom portion of said process chamber.

* * * * *